United States Patent
Zhang

(10) Patent No.: US 9,397,620 B2
(45) Date of Patent: Jul. 19, 2016

(54) HIGH-FREQUENCY BANDWIDTH AMPLIFYING CIRCUIT

(71) Applicant: IPGoal Microelectronics (Sichuan) Co., Ltd., Chengdu, Sichuan (CN)

(72) Inventor: Ziche Zhang, Sichuan (CN)

(73) Assignee: IPGoal Microelectronics (Sichuan) Co., Ltd., Chengdu, Sichuan (CN)

( * ) Notice: Subject to any disclaimer, the term of this patent is extended or adjusted under 35 U.S.C. 154(b) by 39 days.

(21) Appl. No.: 14/062,742

(22) Filed: Oct. 24, 2013

(65) Prior Publication Data

US 2014/0176240 A1  Jun. 26, 2014

(30) Foreign Application Priority Data

Oct. 24, 2012 (CN) .......................... 2012 1 0410207

(51) Int. Cl.
*H03F 1/48* (2006.01)
*H03F 3/19* (2006.01)
*H03F 3/68* (2006.01)

(52) U.S. Cl.
CPC .. *H03F 1/48* (2013.01); *H03F 3/19* (2013.01); *H03F 3/68* (2013.01)

(58) Field of Classification Search
CPC ............... H03F 1/48; H03F 3/19; H03F 3/45; H03F 3/68

USPC .............................................. 330/69, 85, 260
See application file for complete search history.

(56) References Cited

U.S. PATENT DOCUMENTS

| | | | | |
|---|---|---|---|---|
| 5,150,071 A | * | 9/1992 | Bouzidi | ................ G03F 1/3211 330/124 R |
| 7,986,185 B2 | * | 7/2011 | Huang | ............................ 330/98 |
| 8,552,799 B2 | * | 10/2013 | Tsurumi | ............... H03F 1/0244 330/260 |

* cited by examiner

*Primary Examiner* — Steven J Mottola
*Assistant Examiner* — Hazifur Rahman

(57) ABSTRACT

A high-frequency bandwidth amplifying circuit includes a forward channel and a backward channel. An input terminal of the forward channel and an external forward input terminal are connected; an output terminal of the forward channel and a forward output port are connected. An input terminal of the backward channel and an external backward input terminal are connected; an output terminal of the backward channel and a backward output port are connected. The high-frequency bandwidth amplifying circuit further includes a feedback network. The forward channel includes a first operational amplifier and a second operational amplifier. An input terminal of the first operational amplifier is connected to the external forward input terminal; an output terminal of the first operational amplifier is connected to an input terminal of the second operational amplifier; and an output terminal of the second operational amplifier is connected to the forward output port.

1 Claim, 1 Drawing Sheet

HIGH-FREQUENCY BANDWIDTH AMPLIFYING CIRCUIT

BACKGROUND OF THE PRESENT INVENTION

1. Field of Invention

The present invention relates to a field of integrated circuits, and more particularly to a high-frequency bandwidth amplifying circuit.

2. Description of Related Arts

For the various signal receivers in fields of RF communications, optical fiber communications and high-speed serial communications, it is required to amplify the received weak signals before the subsequent treatment. Along with the gradually increased signal frequency, loss of the high-frequency signals during the transmission in the medium gradually increases. As is known to the one skilled in the art, the higher frequency the signals have, the higher bandwidth the amplifying circuit is required to have; the higher loss the signals have, the higher gain of the amplifying circuit is required to have, so that the amplifier is required to have bigger and bigger gain-bandwidth product.

Referring to FIG. 1, a conventional high-frequency bandwidth amplifying circuit is shown. The conventional high-frequency bandwidth amplifying circuit comprises an operational amplifier which comprises a first FET M1 and a second FET M2, wherein a gate electrode of the first FET M1 and a gate electrode of the second FET M2 are connected to an external input terminal IN; a source electrode of the first FET M1 is connected to an external power supply VDD; a source electrode of the second FET M2 is connected to ground; a drain electrode of the first FET M1 and a drain electrode of the second FET M2 are both connected to an output terminal OUT, in such a manner that, via the output terminal OUT, the operational amplifier outputs the amplified high-frequency signal which is inputted by the external input terminal IN. When the operational amplifier is amplifying the inputted high-frequency signals, because of the parasitic capacitor of the first FET M1 and the second FET M2, the high-frequency signals introduce a pole on the transmission channel and the high-frequency signal transfer function decreases 20 db/10 octave at the pole, so as to reduce the bandwidth of the high-frequency signal transfer function decreases. As is known to the one skilled in the art, the amplifier (the operational amplifier) only amplifies the high-frequency signals within the bandwidth; the lower bandwidth, the weaker amplification the amplifier applies on the high-frequency signals. Thus, for the high-frequency bandwidth amplifying circuit, it is necessary to possibly minimize the parasitic capacitor to reduce the effects thereof on the frequency of the high-frequency signals. According to prior arts, the amplifiers usually have small sizes for reducing the parasitic capacitor, but the small-sized amplifiers have a poor current driving ability and thus fail to satisfy working requirements.

Besides, based on the above content, a higher gain bandwidth product can be obtained via providing higher currents and higher power consumption because the gain bandwidth product is directly proportional to a square of the working current. However, the manner is becoming less attractive because the manner needs the relatively high current and also the relatively large power consumption. Along with the further increased requirement of the gain bandwidth product for the high-frequency bandwidth amplifying circuit, further increased currents are no longer able to bring effective increase in the gain bandwidth product because of the restriction of the conventional topological structure, so that the improvement in the gain bandwidth product of the high-frequency bandwidth amplifying circuit hits the bottleneck.

Thus it is necessary to provide an improved high-frequency bandwidth amplifying circuit to overcome the above disadvantages.

SUMMARY OF THE PRESENT INVENTION

An object of the present invention is to provide a high-frequency bandwidth amplifying circuit which has an improved gain bandwidth product, reduced power consumption, a simple operational amplifier, a small parasitic capacitor and low noise.

Accordingly, in order to accomplish the above objects, the present invention provides a high-frequency bandwidth amplifying circuit comprising a forward channel and a backward channel. An input terminal of the forward channel and an external forward input terminal are connected; an output terminal of the forward channel and a forward output port are connected for outputting forward high-frequency signals. An input terminal of the backward channel and an external backward input terminal are connected; an output terminal of the backward channel and a backward output port are connected for outputting backward high-frequency signals. The high-frequency bandwidth amplifying circuit, provided by the present invention, further comprises a feedback network. The forward channel comprises a first operational amplifier and a second operational amplifier, wherein an input terminal of the first operational amplifier is connected to the external forward input terminal; an output terminal of the first operational amplifier is connected to an input terminal of the second operational amplifier; and an output terminal of the second operational amplifier is connected to the forward output port. The backward channel comprises a third operational amplifier and a fourth operational amplifier, wherein an input terminal of the third operational amplifier is connected to the external backward input terminal; an output terminal of the third operational amplifier and an input terminal of the fourth operational amplifier are connected; and an output terminal of the fourth operational amplifier is connected to the backward output port. The feedback network comprises a fifth operational amplifier and a sixth operational amplifier, wherein an input terminal of the fifth operational amplifier is connected to the forward output port; an output terminal of the fifth operational amplifier and an input terminal of the fourth operational amplifier are connected; an input terminal of the sixth operational amplifier is connected to the backward output port; and an output terminal of the sixth operational amplifier is connected to the input terminal of the second operational amplifier.

Preferably, the first operational amplifier, the second operational amplifier, the third operational amplifier and the fourth operational amplifier are all bridged with feedback resistors.

Compared with prior arts, the forward channel and the backward channel of the high-frequency bandwidth amplifying circuit, provided by the present invention, both comprise the two operational amplifiers, so the outputted forward high-frequency signal and the outputted backward high-frequency signal are both processed with a two-stage amplification, which improves the gain bandwidth product of the outputted high-frequency signals. Because the feedback network is connected between the forward channel and the backward channel, the output terminal of the first operational amplifier of the forward channel and the output terminal of the third operational amplifier of the backward channel are both coupled with correspondent inductors, in such a manner that additional zeros are respectively provided at the output terminal of the first operational amplifier and at the output terminal of the third operational amplifier to counteract with the poles provided at the output terminals of the first operational amplifier and the third operational amplifier, to expand a bandwidth of the outputted high-frequency signal and to improve a gain bandwidth product of the outputted high-frequency signal. Moreover, the feedback network connects the forward channel to the backward channel, so that a pseudo-differential circuit turns into a fully differential circuit via the feedback network, which improves a common-mode rejection ratio of the whole high-frequency bandwidth amplifying circuit.

These and other objectives, features, and advantages of the present invention will become apparent from the following detailed description, the accompanying drawings, and the appended claims.

DETAILED DESCRIPTION OF THE PREFERRED EMBODIMENT

As mentioned above, the present invention provides a high-frequency bandwidth amplifying circuit which has an improved gain bandwidth product, reduced power consumption, a simple operational amplifier, a small parasitic capacitor and low noise.

Figure 1:
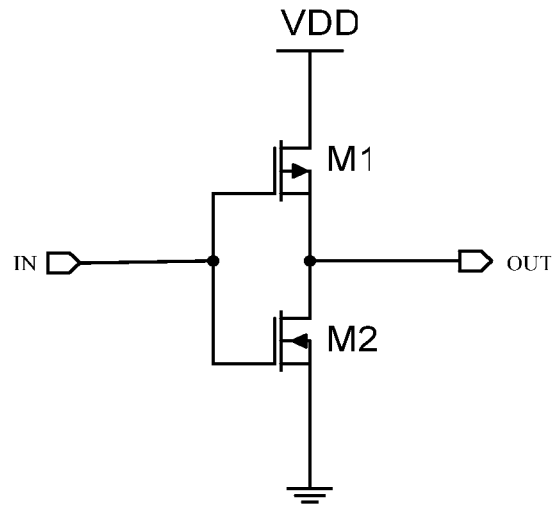
FIG. 1 is a circuit diagram of a conventional high-frequency bandwidth amplifying circuit according to prior arts.
Figure 2:
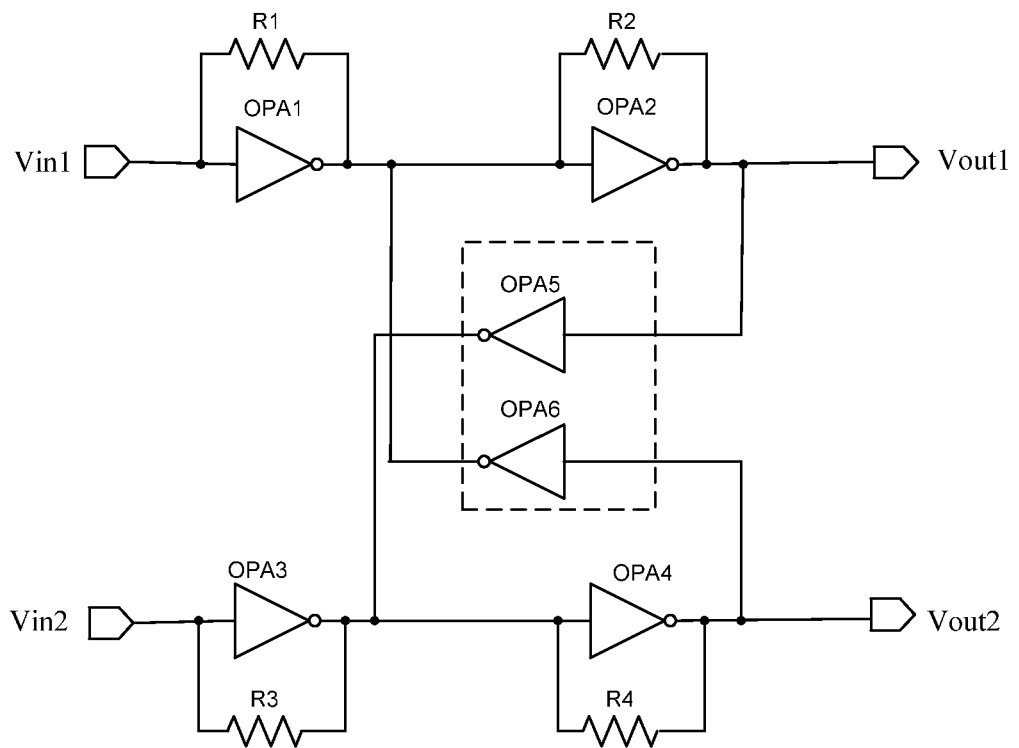
FIG. 2 is a circuit diagram of a high-frequency bandwidth amplifying circuit according to a preferred embodiment of the present invention.

Referring to FIG. 2 of the drawings, according to a preferred embodiment of the present invention, a high-frequency bandwidth amplifying circuit comprises a forward channel, a backward channel and a feedback network. An input terminal of the forward channel and an external forward input terminal Vin1 are connected; an output terminal of the forward channel and a forward output port Vout1 are connected. A forward high-frequency signal is inputted into the forward channel by the external forward input terminal Vin1, amplified by the forward channel and then outputted via the forward output port Vout1. An input terminal of the backward channel and an external backward input terminal Vin2 are connected; an output terminal of the backward channel and a backward output port Vout2 are connected. A backward high-frequency signal is inputted into the backward channel by the external backward input terminal Vin2, amplified by the backward channel and then outputted via the backward output port Vout2, which is similar to the forward channel. The forward channel and the backward channel form a pseudo-differential circuit, so as to output the qualified forward high-frequency signal and the qualified backward high-frequency signal for subsequent load circuits. The feedback network is connected between the forward channel and the backward channel, so the feedback network connects the forward channel to the backward channel, in such a manner that the pseudo-differential circuit turns into a fully differential circuit via the feedback network, which improves a common-mode rejection ratio of the whole high-frequency bandwidth amplifying circuit.

Specifically, the forward channel comprises a first operational amplifier OPAL and a second operational amplifier OPA2, wherein an input terminal of the first operational amplifier OPAL is connected to the external forward input terminal Vin1; an output terminal of the first operational amplifier OPAL and an input terminal of the second operational amplifier OPA2 are connected; an output terminal of the second operational amplifier OPA2 is connected to the forward output port Vout1, namely the first operational amplifier OPAL and the second operational amplifier OPA2 are serially connected between the forward input terminal Vin1 and the forward output port Vout1 and are respectively able to amplify the forward high-frequency signal inputted by the forward input terminal Vin1, in such a manner that the inputted forward high-frequency signal experiences a two-stage amplification in the forward channel before being outputted and the outputted forward high-frequency signal has an improved gain bandwidth product.

The backward channel comprises a third operational amplifier OPA3 and a fourth operational amplifier OPA4, wherein an input terminal of the third operational amplifier OPA3 is connected to the external backward input terminal Vin2; an output terminal of the third operational amplifier OPA3 and an input terminal of the fourth operational amplifier OPA4 are connected; an output terminal of the fourth operational amplifier OPA4 is connected to the backward output port Vout2. Similarly to the forward channel, the backward high-frequency signal inputted by the backward input terminal Vin2 is processed with a two-stage amplification by the third operational amplifier OPA3 and the fourth operational amplifier OPA4 and then outputted via the backward output port Vout2, which improves a gain bandwidth product of the outputted backward high-frequency signal.

The feedback network comprises a fifth operational amplifier OPA5 and a sixth operational amplifier OPA6, wherein an input terminal of the fifth operational amplifier OPA5 is connected to the forward output port Vout1; an output terminal of the fifth operational amplifier OPA5 and an input terminal of the fourth operational amplifier OPA4 are connected; an input terminal of the sixth operational amplifier OPA6 is connected to the backward output port Vout2; an output terminal of the sixth operational amplifier OPA6 is connected to the input terminal of the second operational amplifier OPA2, in such a manner that the fifth operational amplifier OPA5 and the sixth operational amplifier OPA6 forms an active negative feedback network within the whole high-frequency bandwidth amplifying circuit. Moreover, the fifth operational amplifier OPA5 and the sixth operational amplifier OPA6 connect the forward channel to the backward channel, in such a manner that the pseudo-differential circuit turns into the fully differential circuit via the coupling of the feedback network and the whole high-frequency bandwidth amplifying circuit has an improved common-mode rejection ratio. The forward high-frequency signal of the forward output port Vout1 is fed back into the backward channel by the feedback network; the backward high-frequency signal of the backward output port Vout2 is fed back into the forward channel, in such a manner that the backward channel and the forward channel are coupled together via the feedback network. As a result, when the forward high-frequency signal or the backward high-frequency signal externally inputted generates a common-mode noise at some point, via the coupling of the forward channel and the backward channel, the common-mode noise simultaneously acts on the forward high-frequency signal and the backward high-frequency signal as a common-mode signal; and the common-mode noise is eliminated because of inherent features of the fully differential circuit, which improves the common-mode rejection ratio.

Each operational amplifier, OPA1~OPA6, of the present invention has a structure and a function identically to the operational amplifier which is described in the background of the present invention, without repeating again. Besides, as mentioned in the background of the present invention, the poles are introduced on the transmission channel of the high-frequency signal in the high-frequency bandwidth amplifying circuit because of the parasitic capacitor of each operational amplifier, but the poles affect the bandwidth of the outputted high-frequency signal. According to the present invention, a parasitic capacitor of the first operational amplifier OPA1 is defined as C21; the parasitic capacitor generated by a combination of the second operational amplifier OPA2 and the forward output port Vout1 is defined as C22. Correspondently, the parasitic capacitor of the third operational amplifier OPA3 is defined as C31; the parasitic capacitor generated by the combination of the fourth operational amplifier OPA4 and the backward output port Vout2 is defined as C32. Via a deduction of a transfer function of a control theory system the feedback network changes the transfer function of the high-frequency signal from input to output; specifically, according to the present invention, because the feedback network is introduced into the high-frequency bandwidth amplifying circuit, a pole at the output terminal of the first operational amplifier OPA1 of the forward channel is mapped into a zero by the feedback network, which means that the parasitic capacitor C32 of the backward channel exhibits an electric induction at the input terminal of the second operational amplifier OPA2 via the sixth operational amplifier OPA6 of the feedback network as a system negative feedback element; in other words, the parasitic capacitor C32 at the output terminal of the fourth operational amplifier OPA4 is transformed into an equivalent inductor at the output terminal of the first operational amplifier OPA1 via the feedback of the sixth operational amplifier OPA6, in such a manner that a first additional zero is provided at the output terminal of the first operational amplifier OPA1 and the high-frequency signal transfer function increases 20 db/10 octave at the first additional zero, which exactly offsets an influence of the pole generated by the parasitic capacitor C21 at the first additional zero; and thus the sixth operational amplifier OPA6 expands the bandwidth of the high-frequency signal which is outputted by the forward output port Vout1 and increases the forwardly outputted gain bandwidth product of the high-frequency signal while maintaining a high gain. The generation of the pole and the zero and the specific influence on the high-frequency signal thereof are well known to the one skilled in the art, without repeating herein. Similarly, the parasitic capacitor C22 is fed back and coupled to the output terminal of the third operational amplifier OPA3 via the fifth operational amplifier OPA5 as the equivalent inductor; a second additional zero is provided at the output terminal of the third operational amplifier OPA 3 exactly offsets the pole generated by the parasitic capacitor C31 at the second additional zero and increases the gain bandwidth product of the backwardly outputted high-frequency signal. As a conclusion, in the high-frequency bandwidth amplifying circuit of the present invention, the gain bandwidth product of the forwardly outputted high-frequency signal and the backwardly outputted high-frequency signal are respectively increased via the feedback network and outputted stably and reliably; meanwhile, the common-mode rejection ratio of the whole high-frequency bandwidth amplifying circuit is improved.

According to the preferred embodiment of the present invention, each operational amplifier of the forward channel and the backward channel is bridged with a feedback resistor; specifically, the first operational amplifier OPA1 is bridged with a first feedback resistor R1; the second operational amplifier OPA2 is bridged with a second feedback resistor R2; the third operational amplifier OPA3 is bridged with a third feedback resistor R3; and the fourth operational amplifier OPA4 is bridged with a fourth feedback resistor R4, as shown in FIG. 2. Each feedback resistor forms a negative feedback of the correspondent operational amplifier. The negative feedback reduces a load resistance of the correspondent operational amplifier as a front stage, reduces an output load resistance of a current stage, expands a working bandwidth of the outputted high-frequency signal and maintains a relatively constant operational amplifier gain under various art conditions. Besides, the feedback resistors are able to accomplish sampling the voltage and summing the currents (amplifying the currents) of the correspondent operational amplifier, which results in a small structure and low power consumption of the whole high-frequency bandwidth amplifying circuit.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A high-frequency bandwidth amplifying circuit, comprising a forward channel and a backward channel, wherein an input terminal of said forward channel and an external forward input terminal are connected; an output terminal of said forward channel and a forward output port are connected for outputting forward high-frequency signals; an input terminal of said backward channel and an external backward input terminal are connected; and an output terminal of said backward channel and a backward output port are connected for outputting backward high-frequency signals; said forward channel and said backward channel form a pseudo-differential circuit; and further comprising a feedback network, wherein said forward channel comprises a first operational amplifier and a second operational amplifier; an input terminal of said first operational amplifier is connected to said external forward input terminal; an output terminal of said first operational amplifier and an input terminal of said second operational amplifier are connected; an output terminal of said second operational amplifier is connected to said forward output port; said backward channel comprises a third operational amplifier and a fourth operational amplifier; an input terminal of said third operational amplifier is connected to said external backward input terminal; an output terminal of said third operational amplifier and an input terminal of said fourth operational amplifier are connected; an output terminal of said fourth operational amplifier is connected to the backward output port; said feedback network comprises a fifth operational amplifier and a sixth operational amplifier; an input terminal of said fifth operational amplifier is connected to said forward output port; an output terminal of said fifth operational amplifier and an input terminal of said fourth operational amplifier are connected; an input terminal of said sixth operational amplifier is connected to said backward output port; and an output terminal of said sixth operational amplifier is connected to said input terminal of said second operational amplifier; said feedback network is connected between said forward channel and said backward channel, in such a manner that said pseudo-differential circuit turns into a fully differential circuit via said feedback network, which improves a common-mode rejection ratio of said high-frequency bandwidth amplifying circuit;

wherein said first operational amplifier, said second operational amplifier, said third operational amplifier and said fourth operational amplifier are all bridged with feedback resistors.

* * * * *